(12) United States Patent
Stark

(10) Patent No.: US 6,983,235 B2
(45) Date of Patent: Jan. 3, 2006

(54) METHOD AND APPARATUS FOR IMPLEMENTING CONSTANT LATENCY Z-DOMAIN TRANSFER FUNCTIONS USING PROCESSOR ELEMENTS OF VARIABLE LATENCY

(75) Inventor: David Stark, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 894 days.

(21) Appl. No.: 09/841,031

(22) Filed: Apr. 24, 2001

(65) Prior Publication Data

US 2002/0010897 A1 Jan. 24, 2002

Related U.S. Application Data

(60) Provisional application No. 60/199,899, filed on Apr. 26, 2000.

(51) Int. Cl.
*G06F 17/50* (2006.01)
*H04M 1/64* (2006.01)

(52) U.S. Cl. ............ 703/19; 379/88.07; 340/855.5; 716/2; 716/6; 716/8; 716/12; 716/18

(58) Field of Classification Search ............ 703/19; 379/88.07; 340/855.5; 716/2, 8, 6, 12, 18
See application file for complete search history.

(56) References Cited

U.S. PATENT DOCUMENTS 5,212,782 A * 5/1993 Asato et al. ............ 716/6
6,005,377 A * 12/1999 Chen et al. ............ 323/283
6,317,819 B1 * 11/2001 Morton ............ 712/22

OTHER PUBLICATIONS

Steve Haynal, Behrooz Parhami, "Arthmetric Structures for Inner-Product and Other Computations Based on a Latency-Free Bit-Serial Multiplier Design", IEEE 1997, pp. 197-201.*
David A. Dunn, Wei-Chung Hsu, "Instruction Scheduling for the HP-PA-8000", IEEE 1996, pp. 298-307.*

* cited by examiner

*Primary Examiner*—W. Thomson
*Assistant Examiner*—Dwin Craig
(74) *Attorney, Agent, or Firm*—Harrity & Snyder LLP

(57) ABSTRACT

In an illustrative embodiment, a desired signal processing transfer function is implemented using a generic pipelined data processor having variable latency followed by a variable latency multistage FIFO. The delay of the multistage FIFO is varied dynamically to keep the number of outstanding samples (and thus the overall latency) a constant. The present invention enables an abstract approach to the design of higher-level signal processing transfer functions while the design of the underlying low-level circuitry is driven solely by target implementation technology issues. Thus, the higher-level design of signal processing transfer functions is decoupled from the low-level (logic and physical) design. Furthermore, test bench modules and vectors for testing the transfer function can also be to be prepared independent of the specifics of the low-level circuitry associated with the target implementation technology. The transfer functions of the present invention may be readily mapped onto any of multiple target implementation technologies. The inventive approach also permits changes in an underlying arithmetic library to be made without requiring changes in the higher-level signal processing transfer function design.

31 Claims, 3 Drawing Sheets

METHOD AND APPARATUS FOR IMPLEMENTING CONSTANT LATENCY Z-DOMAIN TRANSFER FUNCTIONS USING PROCESSOR ELEMENTS OF VARIABLE LATENCY

CROSS REFERENCE TO RELATED APPLICATIONS

This application claims priority from the following provisional patent application, the disclosure of which is herein incorporated by reference for all purposes: U.S. Provisional Patent Application Ser. No. 60/199,899, entitled "METHOD AND APPARATUS FOR IMPLEMENTING CONSTANT LATENCY Z-DOMAIN TRANSFER FUNCTIONS USING PROCESSOR ELEMENTS OF VARIABLE LATENCY," David Stark, filed Apr. 26, 2000.

BACKGROUND

A number of difficult issues may arise in the design of hardware-based Z-domain transfer functions for digital signal processing. Presently, there is a tight coupling between the higher-level transfer function design and the low-level (logic and physical) design. Specifically, the approach taken to carrying out a transfer function has previously been strongly influenced by the target implementation technology and its associated function libraries.

A companion issue is the preparation of the "test bench"—the suite of simulation vectors and modules (frequently implemented in either VHDL or the C programming language) that apply stimuli, compare the simulated and expected results, and report differences. If there is a tight coupling between the transfer function design and the target implementation technology, then major portions of the test bench may need to be redone if the target technology changes. This can be a major undertaking.

Popular implementation technologies include Field Programmable Gate Arrays (FPGAs), Application Specific Integrated Circuits (ASICs), as well as semi-custom and custom approaches. Because of the economics of physical design, tooling costs, and manufacturing costs, the implementation technology is often chosen based on anticipated production volumes. As production volumes increase or revised production estimates are made, and for many other technical or business reasons, a shift to a different implementation technology may become desirable. However, the approach taken to the logic design of a desired transfer function is constrained in different ways by the vagaries of each particular technology. This can make retargeting the transfer functions from one technology to another a significant effort.

Consider the design of a feedback system 1000, canonically modeled in FIG. 1. R(z) 50 is the reference signal, A(z) 100 is the open loop transfer function, C(z) 60 is the control signal (the output in this case), and summer 200 compares R(z) and C(z) to generate the input 55 to A(z). T(z), the closed loop transfer function is well known as:

$$T(z) \equiv \frac{C(z)}{R(z)} = \frac{A(z)}{1 + A(z)}$$

In general, the implementation of A(z) may be complex and require more than one hardware clock cycle to compute. In fact, in order to achieve system throughput requirements, A(z) may need to be very deeply pipelined. The hardware clock cycles may be chosen to be at some integer sub-multiple of the sampling rate. However, in pipelines designed for optimum performance on an individual operation basis, generally the latency of the pipeline is an implementation-specific number of hardware clock cycles. If such pipelines are used within A(z), samples emerging from the output of A(z) may not coincide with samples at the input. In such cases the "sampling clock," a signal indicating which hardware clock cycles contain valid samples, must itself be stepped down the pipeline with the data.

Furthermore, performance-optimized pipelines generally process some samples using 11 more hardware clock cycles than for other samples. Hence, the sampling rate at the input of A(z) may not be regular and the number of samples "in flight" down the pipeline may vary. Thus the order ($z^{-N}$) of A(z) may change dynamically, and if expressed in reduced form, the closed loop transfer function T(z) would be a very non-linear time-varying function. Such variable latency is not suitable for use in implementing signal processing transfer functions.

In order to guarantee an implementation of A(z) that produces output samples of constant latency and coincident with the input samples, the pipeline of A(z) could be specifically designed to shift in "lock-step" with the sampling clock at the input. Unfortunately, depending on the implementation specifics, this is often not a viable approach. For example, in an FPGA implementation the multipliers need to be deeply pipelined to achieve ASIC-like clock rates. Because of this, the time to compute an intermediate result may exceed a single sample and thus not be coincident with the input samples.

What are needed are hardware architectures and methods that permit the higher-level design of signal processing transfer functions to be completely decoupled from the specifics of the low-level circuitry associated with the target implementation technology.

What are needed are hardware architectures and methods that permit the test bench modules and vectors prepared for testing the transfer function to be completely decoupled from specifics of the low-level circuitry associated with the target implementation technology.

What are needed are hardware architectures and methods that permit an abstract generic "data processor" approach to the design of higher-level signal processing transfer functions while the design of the underlying low-level circuitry is driven solely by target implementation technology issues.

What are needed are hardware architectures and methods that permit the straightforward mapping of signal processing transfer functions onto any of multiple target implementation technologies.

What are needed are hardware architectures and methods that permit changes in an underlying arithmetic library to be made without requiring changes in the higher-level signal processing transfer function design.

SUMMARY

The present invention teaches how to implement z-domain transfer functions having constant latency using elements that have variable latency. Thus, the stage-delay for signals processed through a transfer function may be maintained constant even though the transfer function is implemented using building blocks that have variable stage-delays.

In an illustrative embodiment, a desired transfer function is implemented using a generic pipelined data processor having variable latency followed by a controlled variable-delay multistage FIFO. The delay of the multistage FIFO is varied dynamically to keep the number of outstanding samples (and thus the overall latency) a constant for the overall transfer function.

The invention enables an abstract approach to the design of higher-level signal processing transfer functions while the design of the underlying low-level circuitry is driven solely by target implementation technology issues. Thus the higher-level design of signal processing transfer functions is decoupled from the low-level (logic and physical) design. Furthermore, test bench modules and vectors for testing the transfer function can also be to be prepared independent of the specifics of the low-level circuitry associated with the target implementation technology.

The transfer functions of the present invention may be readily mapped onto any of multiple target implementation technologies. The inventive approach also permits changes in an underlying arithmetic library to be made without requiring changes in the higher-level signal processing transfer function design.

DETAILED DESCRIPTION

Figure 2:
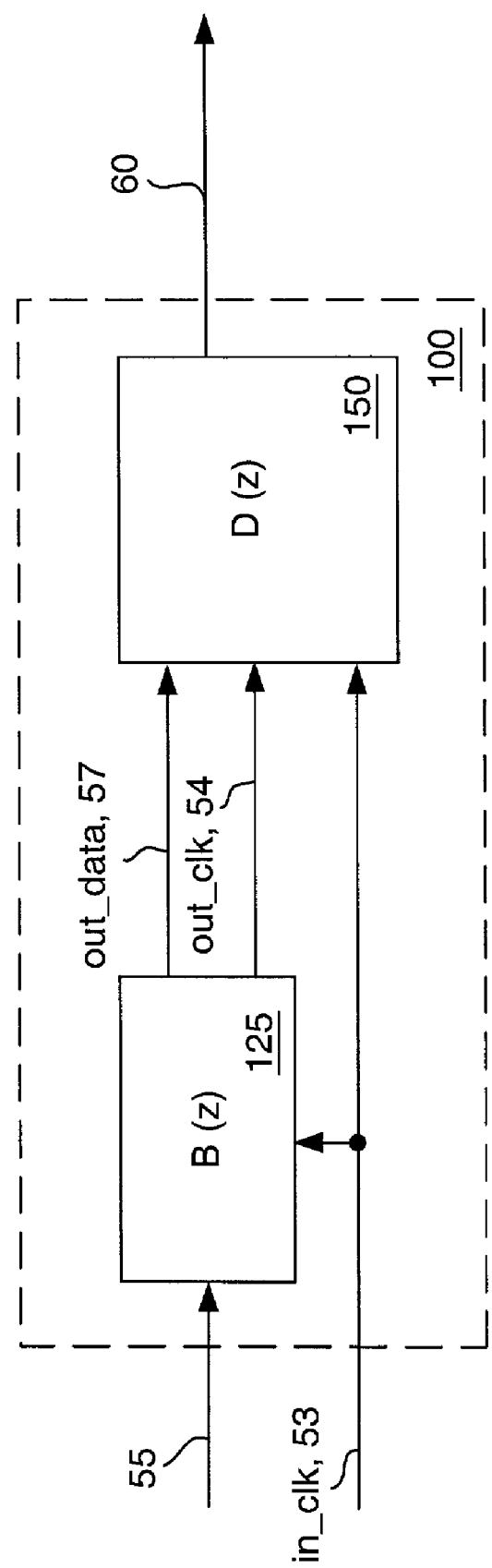
FIG. 2 illustrates the decomposition of the function A(z) of FIG. 1, in accordance with the present invention.

In accordance with the present invention, A(z) is conceptually decomposed into two parts, as shown in FIG. 2. B(z) 125 is a generic pipelined data processor and D(z) 150 is a controlled variable-delay (variable latency) multistage FIFO. The two blocks together implement A(z) 100. B(Z) 125 accepts an input sample on input 55, and an input sample clock (in_clk) 53. B(z) 125 produces an output sample (out_data) 57 and an output sample clock (out_clk) 54.

B(z) 125 must be designed to achieve the desired bandwidth, but there are no requirements regarding latency. Thus, B(z) 125 can be as deeply pipelined as necessary to facilitate performance, and the pipeline latency need not be constant for every sample. At a low-level B(z) 125 is synchronous with the master hardware clock that drives all the flip-flops in the design, but the output clock (out_clk) 54 does not need to be coincident with the input clock (in_clk) 53. The output clock (out_clk) 54 must operate at the same throughput as the input clock (in_clk) 53, but it may be delayed an arbitrary number of hardware clock cycles and the spacing between the edges of the output clock (out_clk) 54 can be irregular.

The implementation of D(z) 150 consists of two major components. The first component is a delay line 154 (a multistage FIFO pipeline) that shifts data forward one stage on each edge of the output clock (out_clk) 54 of B(z) 125. Output samples on out_data 57 are shifted into this delay line. Those skilled in the art will recognize the functionality of the FIFO pipeline can be implemented using any of a number of techniques, including coupled static registers, appropriately clocked latches, and custom dynamic memory arrays, without departing from the scope of the invention.

The second major component is a selector 153 (multiplexor). The output of each register stage of the delay line 154 is provided to a respective data input of the selector 153. The register stage outputs are collectively shown as the group of signals 62. The selector 153 is used to select the output of one of the register stages in the delay line 154 for coupling to the output 60. Those skilled in the art will recognize that the functionality of the selector 153 may be implemented using any of a number of techniques, including pass-gates, AND-OR gating, PLAs, and tri-state busing, without departing from the scope of the invention. Those skilled in the art will also recognize that some manner of custom or hybrid integrated structure may be able to combine the FIFO and selector functions, again without departing from the scope of the invention.

Figure 3:
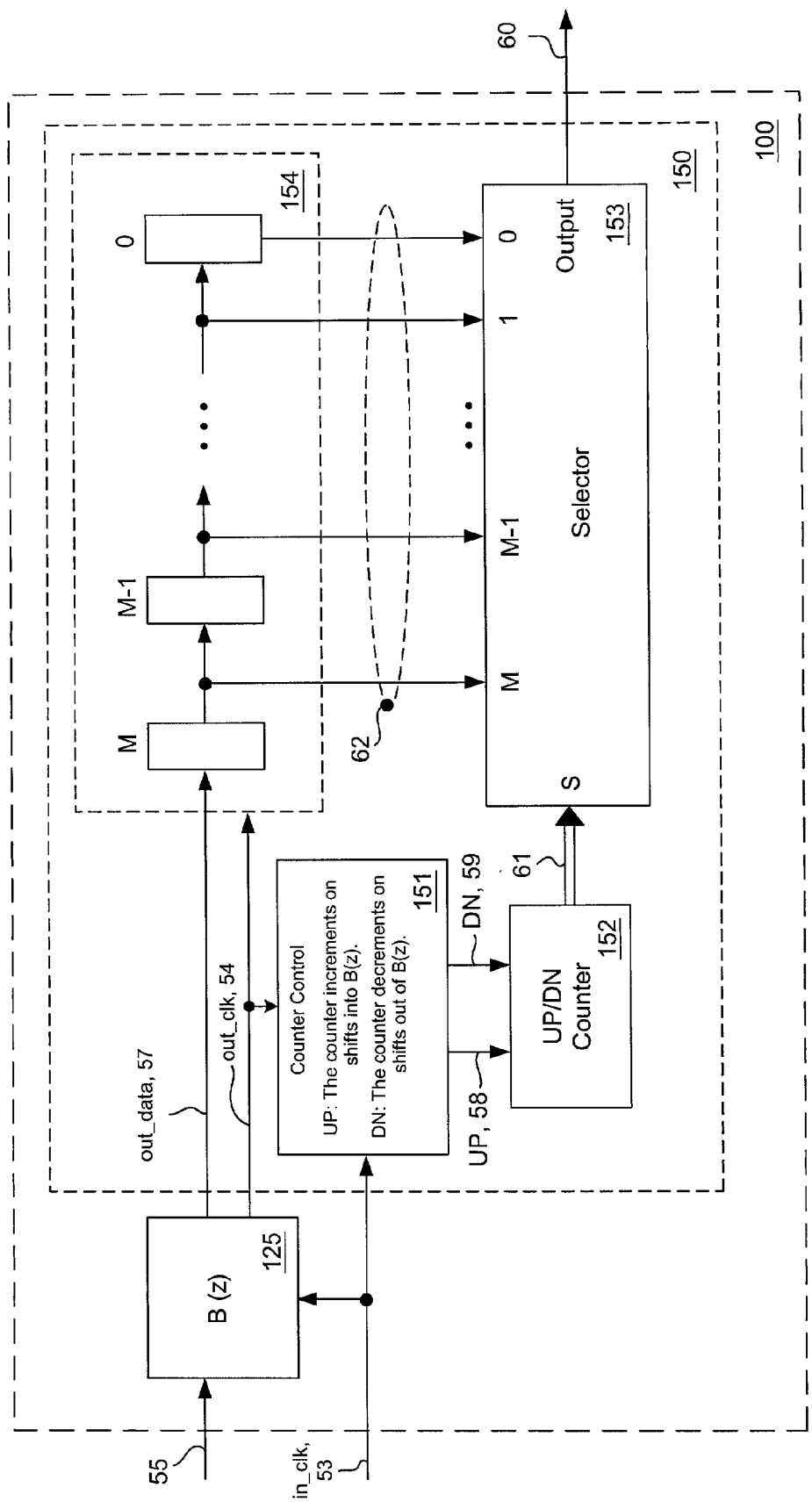
FIG. 3 provides additional detail of the function D(z) of FIG. 2, in accordance with the present invention.

The delay line 154 and selector 153 of D(z) 150 and their relationship to B(z) 125 is shown in FIG. 3. Counter Control 151 and UP/DN Counter 152 control the selector 153 via selector controls 61. When the output sample (out_data) 57 shifts out of B(z), out_clk 54 is asserted and the counter counts down by one. The value in this counter controls selector 153. When the counter 152 is zero, it selects the last register in the delay line 154. When the counter 152 is at it largest value, it selects the first register in the delay line 154. As B(z) 125 'fills up' the delay in D(z) 150 shortens and the sum of the two, the number of outstanding samples, remains constant. Those skilled in the art will recognize that the functionality of the selector control (including the counter) may be implemented using any of a number of techniques, including shift registers and any of a variety of state machine types, without departing from the scope of the invention.

Consider first the operation of the logic of FIG. 3, when samples are shifting out of B(z). For this example, assume that no samples are shifting into B(z), but B(z) is producing outputs. These output samples on out_data 57 get shifted into the delay line 154. If the selector 153 is selecting the output of register M before the delay line shifts, then when B(z) produces an output sample, the contents of register M will shift over to register M−1, the counter 152 will decrement, and the selector 153 will now select the output of register M−1. In other words, from an outside worldview, nothing has changed (the output is the same). A sample has moved from B(z) 125 into the delay line 154, but the total number of outstanding samples is the same.

Next consider the operation of the logic of FIG. 3, when samples are shifting into B(z). This occurs in conjunction with a new edge of in_clk 53. Coincident with the data shifting into B(z), the UP/DN Counter 152 will increment. The selector 153, if it was selecting M−1, will now select M. The last sample has been dropped of the end, and a new sample has been accepted into the pipeline. From the outside worldview, the overall operation is that of a delay line that shifted in lock step with the input clock. This is exactly what is desired for implementation of the signal processing transfer functions independent of the low-level circuitry.

Figure 1:
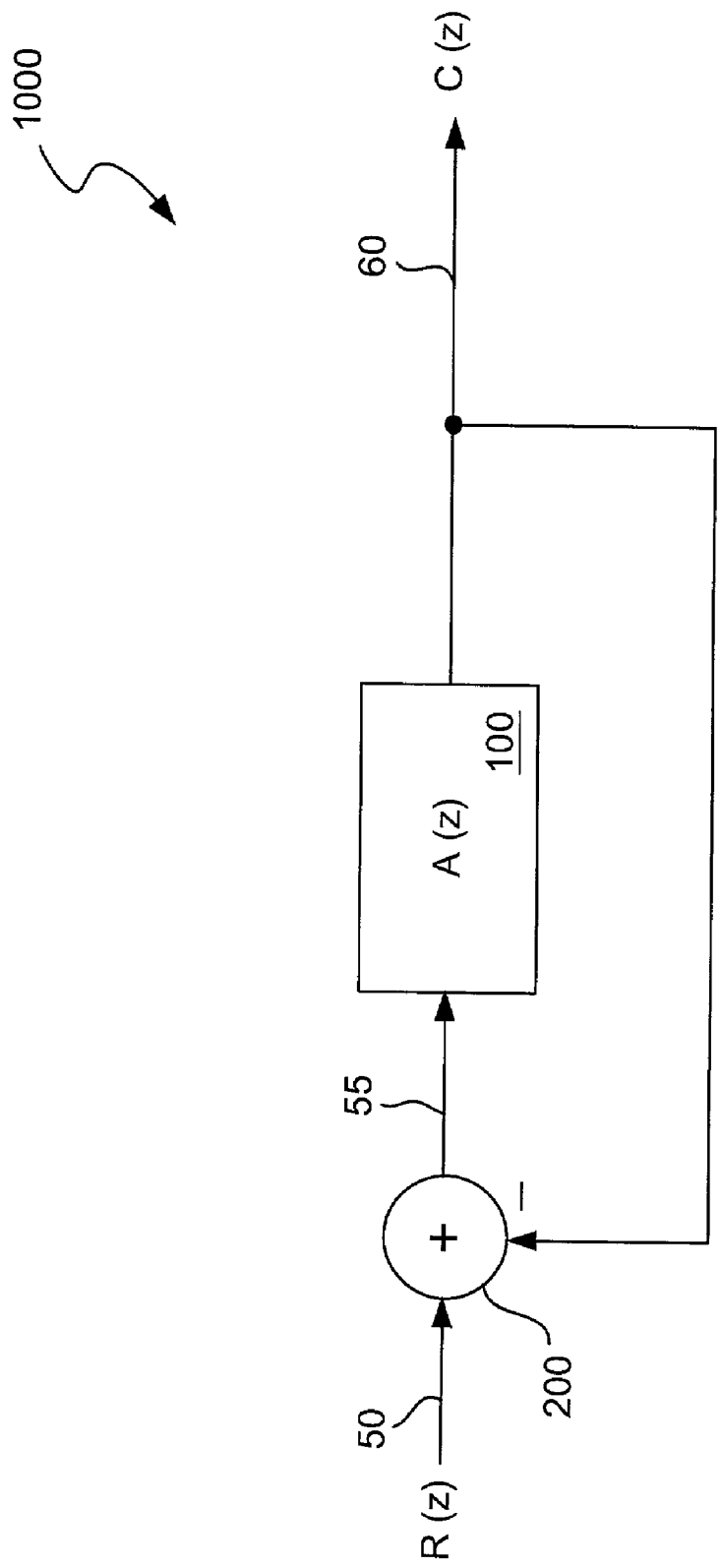
FIG. 1 illustrates a prior art canonical feedback system.

The foregoing illustrates the process of the present invention by which a constant latency open loop transfer function A(z) 100 may be decomposed into a partition B(z) 125, implemented using a variable latency generic data processor, and a partition D(z) 150, implemented using a controlled-latency multistage FIFO. The open loop transfer function A(z) can then be used as a building block for the closed loop system 1000 of FIG. 1, or for other signal processing applications. The controlled latency multistage FIFO D(z) 150, is responsible for maintaining the constant latency of the overall transfer function A(z) 100. Provided that D(z) 150 has a maximum latency depth that is larger than the maximum latency depth of B(z) 125, the overall transfer function latency has been decoupled and is completely independent of the latency of B(z).

Assuming that the open-loop transfer-function can be written as:

$$A(z) = z^{-N} B(z)$$

Then the additional delay (the N samples of $z^{-N}$) can be easily added to the A(z) test bench modules, and the same test vectors will be applicable regardless of the target implementation technology used for B(z). Thus the preparation of the test bench is also decoupled from the target implementation technology (whether it be FPGA, or ASIC, or whatever).

CONCLUSION

Although the present invention has been described using particular illustrative embodiments, it will be understood that many variations in construction, arrangement and use are possible consistent with the teachings and within the scope of the invention. For example, interconnect and function-unit bit-widths, clock speeds, and the type of technology used may generally be varied in each component block of the invention. Also, unless specifically stated to the contrary, the value ranges specified, the maximum and minimum values used, or other particular specifications are merely those of the illustrative or preferred embodiments, can be expected to track improvements and changes in implementation technology, and should not be construed as limitations of the invention. Functionally equivalent techniques known to those skilled in the art may be employed instead of those illustrated to implement various components or sub-systems. It is also understood that many design functional aspects may be carried out in either hardware (i.e., generally dedicated circuitry) or software (i.e., via some manner of programmed controller or processor), as a function of implementation dependent design constraints and the technology trends of faster processing (which facilitates migration of functions previously in hardware into software) and higher integration density (which facilitates migration of functions previously in software into hardware).

All such variations in design comprise insubstantial changes over the teachings conveyed by the illustrative embodiments. The names given to interconnect and logic are illustrative, and should not be construed as limiting the invention. It is also understood that the invention has broad applicability to other signal processing applications, and is not limited to the particular canonical closed loop transfer function of the illustrated embodiments. The present invention is thus to be construed as including all possible modifications and variations encompassed within the scope of the appended claims.

What is claimed is:

1. A method of designing digital signal processing hardware to implement a z-domain transfer function, wherein the processing of signal samples is characterized by constant latency, the method comprising:
   a) specifying said transfer function;
   b) without regard to latency characteristics, specifying a first hardware stage to process said signal samples in accordance with said transfer function; and
   c) specifying a second hardware stage to dynamically and selectively delay said signal samples processed by said first hardware stage such that the combined first and second stage latency for the processing of said signal samples is a constant.

2. The method of designing digital signal processing hardware of claim 1, wherein said first hardware stage is a generic data processor.

3. The method of designing digital signal processing hardware of claim 1, wherein said second hardware stage includes a multistage FIFO.

4. The method of designing digital signal processing hardware of claim 1, wherein said second stage includes a selector that couples to the second stage output a selected one of a plurality of sequentially delayed variations of the samples provided to the second stage input.

5. The method of designing digital signal processing hardware of claim 4, wherein the selector control is a function of shifts into and out of said first stage.

6. The method of designing digital signal processing hardware of claim 4, wherein the selector control includes an up/down counter.

7. The method of designing digital signal processing hardware of claim 1, further including:
   independent of said specifying of said first hardware stage, specifying the target implementation technology.

8. The method of designing digital signal processing hardware of claim 7, wherein the target implementation technology is a design approach selected from the group consisting of FPGA, ASIC, semi-custom, and custom.

9. The method of designing digital signal processing hardware of claim 1, further including:
   independent of said specifying of said first hardware stage, specifying the target arithmetic library.

10. The method of designing digital signal processing hardware of claim 1, further including:
    a) specifying a first technology as the target implementation technology; and
    b) after said specifying of said target implementation technology and said specifying of said first hardware stage, and without requiring modification of the specification of said first hardware stage, changing the target implementation technology to a second technology.

11. The method of designing digital signal processing hardware of claim 1, further including:
    a) specifying a test bench for the testing of the transfer function, said test bench including simulation modules and test vectors, said transfer function being conceptually modeled as being of the form $z^{-N}$ X T(z), where T(z) is the desired transfer function and where the realization of the $z^{-N}$ delay may be configured independent of other aspects of the test bench;
    b) specifying a first technology as the target implementation technology and specifying the $z^{-N}$ delay based on the target implementation technology; and
    c) after said specifying of said first hardware stage, said test bench, said target implementation technology, and said $z^{-N}$ delay, changing the target implementation technology to a second technology without requiring revised specification of said first hardware stage and without requiring modification of said test bench beyond the revised specification of said $z^{-N}$ delay in accordance with the second technology.

12. The method of designing digital signal processing hardware of claim 1, further including:
    a) specifying a first library as the target arithmetic library; and
    b) after said specifying of said first library and said specifying of said first hardware stage, and without requiring modification of the specification of said first hardware stage, changing the target arithmetic library to a second library.

13. The method of designing digital signal processing hardware of claim 1, further including:
   a) specifying a test bench for the testing of the transfer function, said test bench including simulation modules and test vectors, said transfer function being conceptually modeled as being of the form $z^{-N} \times T(z)$ where $T(z)$ is the desired transfer function and where the realization of the $z^{-N}$ delay may be configured independent of other aspects of the test bench;
   b) specifying a first library as the target arithmetic library and specifying the $z^{-N}$ delay based on the target arithmetic library; and
   c) after said specifying of said first hardware stage, said test bench, said target arithmetic library, and said $z^{-N}$ delay, changing the target arithmetic library to a second library without requiring revised specification of said first hardware stage and without requiring modification of said test bench beyond the revised specification of said $z^{-N}$ delay in accordance with the second library.

14. A method of operating digital signal processing hardware to implement a z-domain transfer function, wherein the processing of signal samples is characterized by constant latency, the method comprising:
   a) providing a first and second hardware stage;
   b) configuring and operating said first hardware stage to process said signal samples in accordance with said transfer function, said first hardware stage processing said signal samples with variable latency; and
   c) operating said second hardware stage to dynamically and selectively delay said signal samples processed by said first hardware stage such that the combined first and second stage latency for the processing of said signal samples is a constant.

15. The method of operating digital signal processing hardware of claim 14, wherein said first hardware stage is a generic data processor.

16. The method of operating digital signal processing hardware of claim 14, wherein said second hardware stage includes a multistage FIFO.

17. The method of operating digital signal processing hardware of claim 14, wherein said second stage includes a selector that couples to the second stage output a selected one of a plurality of sequentially delayed variations of the samples provided to the second stage input.

18. The method of operating digital signal processing hardware of claim 17, wherein the selector control is a function of shifts into and out of said first stage.

19. The method of operating digital signal processing hardware of claim 17, wherein the selector control includes an up/down counter.

20. Circuitry for implementing a z-domain transfer function for the processing of signal samples, the circuitry comprising:
   a) transfer function circuitry, said transfer function circuitry processing said signal samples in a first variable length pipeline in accordance with said transfer function, said transfer function circuitry processing V samples at any given time;
   b) delay circuitry following said transfer function circuitry, said delay circuitry delaying in a second variable length pipeline signal samples processed previously by said transfer function circuitry, said delay circuitry delaying D of samples at any given time; and
   c) delay circuitry control logic coupled to said transfer function circuitry and said delay circuitry and dynamically adjusting the number of said D samples to maintain the sum of V and D as a constant.

21. The circuitry for implementing a z-domain transfer-function of claim 20, wherein said transfer function circuitry includes a generic data processor.

22. The circuitry for implementing a z-domain transfer function of claim 20, wherein said second delay circuitry includes a multistage FIFO.

23. The circuitry for implementing a z-domain transfer function of claim 20, wherein said delay circuitry includes a selector that couples to the delay circuitry output a selected one of a plurality of sequentially delayed variations of the samples provided to the delay circuitry input.

24. The circuitry for implementing a z-domain transfer function of claim 23, wherein the delay circuitry control is a function of shifts into and out of said transfer function circuitry.

25. The circuitry for implementing a z-domain transfer function of claim 23, wherein the delay circuitry control includes an up/down counter.

26. A digital signal processing building bock for processing block-input signal samples to create block-output signal samples in accordance with the closed-loop z-domain transfer function $A(z)/(1+A(z))$, where $A(z)$ is an open-loop transfer function, the building block comprising:
   a) $B(z)$ transfer function circuitry having a $B(z)$-input and a $B(z)$-output, said $B(z)$ transfer function circuitry processing signal samples received at the $B(z)$-input in a first variable length pipeline in accordance with a $B(z)$ transfer function, said $B(z)$ transfer function circuitry processing V signal samples at any given time;
   b) $D(z)$ delay circuitry following said $B(z)$ transfer function circuitry, wherein $A(z)=B(z) \times D(z)$, said $D(z)$ delay circuitry delaying in a second variable length pipeline samples received from said $B(z)$-output, the delay circuitry delaying D signal samples at any given time before providing them as the block-output signal samples;
   c) $D(z)$ delay circuitry control logic coupled to said $B(z)$ transfer function circuitry and said $D(z)$ delay circuitry and dynamically adjusting the pipeline length of $D(z)$ to maintain the sum of V and D as a constant; and
   d) a summer having a positive input, a negative input, and a difference output, said positive input receiving block-input signal samples, said negative input receiving said block-output signal samples, said difference output providing difference signal samples to the $B(z)$-input.

27. The digital signal processing building bock of claim 26, wherein said $B(z)$ transfer function circuitry includes a generic data processor.

28. The digital signal processing building bock of claim 26, wherein said $D(z)$ delay circuitry includes a multistage FIFO.

29. The digital signal processing building bock of claim 26, wherein said $D(z)$ delay circuitry includes a selector that couples to the block-output a selected one of a plurality of sequentially delayed variations of the samples provided by the $B(z)$-output.

30. The digital signal processing building bock of claim 26, wherein the $D(z)$ delay circuitry control is a function of shifts into and out of said $B(z)$ transfer function circuitry.

31. The digital signal processing building bock of claim 26, wherein the $D(z)$ delay circuitry control includes an up/down counter.

* * * * *